United States Patent
Torrents Abad

(10) Patent No.: US 10,964,581 B1
(45) Date of Patent: Mar. 30, 2021

(54) SELF-ALIGNED ADHESIVE LAYER FORMATION IN LIGHT-EMITTING STRUCTURE FABRICATION

(71) Applicant: Facebook Technologies, LLC, Menlo Park, CA (US)

(72) Inventor: Oscar Torrents Abad, Cork (IE)

(73) Assignee: FACEBOOK TECHNOLOGIES, LLC, Menlo Park, CA (US)

(*) Notice: Subject to any disclaimer, the term of this patent is extended or adjusted under 35 U.S.C. 154(b) by 144 days.

(21) Appl. No.: 16/388,766

(22) Filed: Apr. 18, 2019

Related U.S. Application Data

(60) Provisional application No. 62/747,243, filed on Oct. 18, 2018.

(51) Int. Cl.
  *H01L 21/70* (2006.01)
  *H01L 33/10* (2010.01)
  *H01L 21/683* (2006.01)
  *H01L 33/30* (2010.01)
  *H01L 33/62* (2010.01)

(52) U.S. Cl.
  CPC .......... *H01L 21/6835* (2013.01); *H01L 33/30* (2013.01); *H01L 33/62* (2013.01); *H01L 2221/68368* (2013.01)

(58) Field of Classification Search
  CPC .................. H01L 21/6835; H01L 33/30; H01L 2221/68368; H01L 33/62
  See application file for complete search history.

(56) References Cited

U.S. PATENT DOCUMENTS 10,325,893 B2 * 6/2019 Chong ................ H01L 33/0093

* cited by examiner

*Primary Examiner* — Jeffry H Aftergut
(74) *Attorney, Agent, or Firm* — Weaver Austin Villeneuve & Sampson LLP

(57) ABSTRACT

Techniques are disclosed for fabricating light-emitting structures in which recesses in a carrier adhesive layer are formed after singulation of the light-emitting structures. These recesses are self-aligned with the light-emitting structures and enable a pickup adhesive layer to be formed on each of the light-emitting structures without the need for creating an etching mask or etching the pickup adhesive layer.

20 Claims, 13 Drawing Sheets

US 10,964,581 B1

SELF-ALIGNED ADHESIVE LAYER FORMATION IN LIGHT-EMITTING STRUCTURE FABRICATION

CROSS-REFERENCE TO RELATED APPLICATIONS

This application claims the benefit of U.S. Provisional Application No. 62/747,243, filed Oct. 18, 2018, entitled "Self-Aligned Adhesive Layer Formation in Light-Emitting Structure Fabrication", which is assigned to the assignee hereof, and incorporated herein in its entirety by reference.

BACKGROUND

Modern electronics such as virtual reality (VR), augmented reality (AR), and/or mixed reality (MR) devices, may include displays with very small light-emitting diodes (LEDs). One or more of these LEDs may be disposed on light-emitting structures, and displays may comprise multiple light-emitting structures.

SUMMARY

Embodiments address these and other issues by utilizing techniques in which recesses in a carrier adhesive layer are formed after singulation of the light-emitting structures. These recesses are self-aligned with the light-emitting structures and enable a pickup adhesive layer to be formed on each of the light-emitting structures without the need for creating an etching mask or etching the pickup adhesive layer.

BRIEF DESCRIPTION OF THE DRAWINGS

Illustrative embodiments are described with reference to the following figures.

The figures depict embodiments of the present disclosure for purposes of illustration only. One skilled in the art will readily recognize from the following description that alternative embodiments of the structures and methods illustrated may be employed without departing from the principles of, or benefits touted in, this disclosure. Coordinate frames including two or three mutually orthogonal axes (e.g., XY, XZ, and/or XYZ axes) have been included in some figures, to help illustrate how components illustrated in these figures may be oriented, relative to other figures.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label. Additionally, where a figure may illustrate multiple components and/or features of the same type, only a portion of the components and/or features may be labeled in some instances, to avoid clutter in the figure.

DETAILED DESCRIPTION

Several illustrative embodiments will now be described with respect to the accompanying drawings, which form a part hereof. While particular embodiments, in which one or more aspects of the disclosure may be implemented, are described below, other embodiments may be used and various modifications may be made without departing from the scope of the disclosure or the spirit of the appended claims.

During manufacture of these displays, light-emitting structures can be physically placed on a backplane using a pick up tool (PUT) and subsequently bonded to the backplane. A pickup adhesive layer, such as an elastomer layer (or "eLayer") may be formed on the light-emitting structures to enable the PUT to adhere to the light-emitting structures in order to manipulate them during manufacturing.

Traditional techniques for forming a pickup adhesive layer on the light-emitting structures can be inefficient and ineffective. Some processes, for example, involve depositing the pickup adhesive layer on multiple light-emitting structures, then etching the pickup adhesive layer between the light-emitting structures to make them each individually manipulable. But this can involve creating a mask for etching that involves multiple photolithographic steps, and the mask itself may not be well-aligned with the underlying light-emitting structures.

Embodiments are described herein with reference to the figures, where like reference numbers indicate identical or functionally similar elements. Also in the figures, the left most digit of each reference number corresponds to the figure in which the reference number is first used.

Figures 2A, 2B:
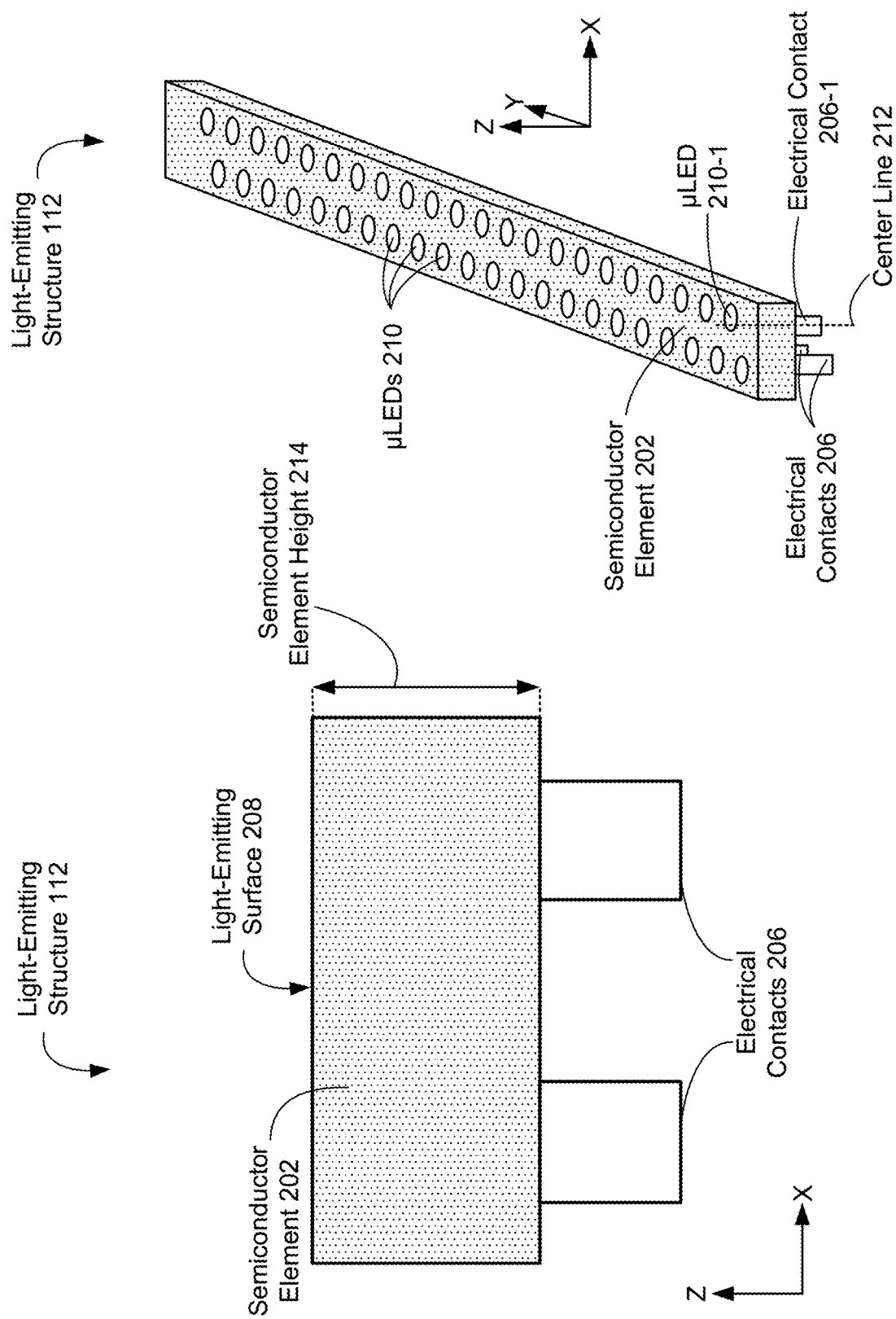
FIG. 2A is a cross-sectional view of a schematic diagram of a light-emitting structure, according to an embodiment.
FIG. 2B is a perspective view of a light-emitting structure, according to an embodiment.

As used herein, a micro-LED (or "µLED") may refer to an LED that has an active light-emitting area with a linear dimension that is less than 50 µm, less than 20 µm, or less than 10 µm. For example, the linear dimension may be as small as 2 µm or 4 µm. As shown in FIG. 2B and described herein, light-emitting structures may comprise multiple µLEDs.

Figure 1:
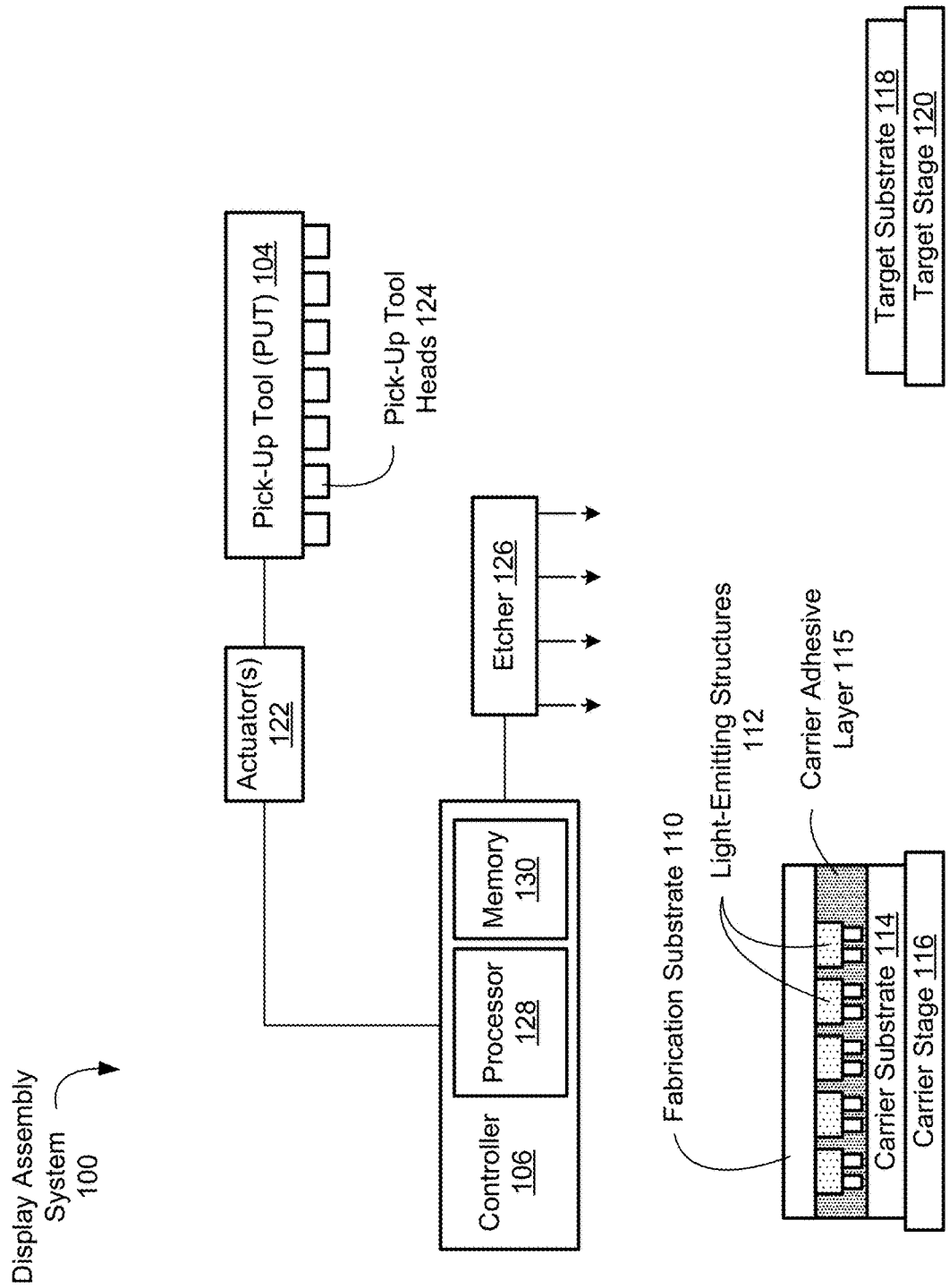
FIG. 1 is a simplified illustration of a display assembly system, according to an embodiment.

FIG. 1 is a simplified illustration of a display assembly system 100, according to one embodiment. The display assembly system 100 fabricates a display device through a pick-and-place technique. Specifically, the display assembly system 100 assembles a display by picking up light-emitting structures, which may comprise micro-LEDs (µLEDs), from a carrier substrate 114, and places them onto a target substrate 118. In some embodiments, the light-emitting structures 112 are LED dies that emit a different color. In some embodiments, the light-emitting structures 112 are different color µLEDs having a reduced divergence of light output and a small light-emitting area. The carrier substrate 114, or "hard handle," may comprise a glass substrate or similar structure that holds the light-emitting structures 112 for pick up by the pickup tool (PUT) 104. The PUT 104 may be referred to as a pick and place head (PPH) array. In other embodiments, the carrier substrate 114 may comprise the native substrate on which the light-emitting structures 112 are grown. Alternatively, as discussed in further detail below, the light-emitting structures 112 may be grown on a fabrication substrate and attached to the carrier substrate 114 via a carrier adhesive layer 115, in which case the fabrication substrate 110 may be removed and the carrier adhesive layer 115 may be (completely or partially) removed to enable extraction of the light-emitting structures 112 from the carrier substrate 114.

The target substrate 118 may be a display substrate, or may be an intermediate carrier substrate that facilitates bonding with a display substrate. The display assembly system 100 places light-emitting structures 112 at locations of the display substrate, and then bonds the light-emitting structures 112 to the display substrate.

As shown, the display assembly system 100 further includes a PUT 104, an actuator 122, a carrier stage 116, and a target stage 120. The carrier stage 116 holds a carrier substrate 114 having one or more light-emitting structures 112. The target stage 120 holds a target substrate 118 to receive some or all of the light-emitting structures 112 from the carrier substrate 114.

A controller 106 may be communicatively coupled with the PUT 104 (e.g., via the actuator 122) and control the operations of the PUT 104. For example, the controller 106 causes the PUT 104 to pick up one or more light-emitting structures 112 located on a carrier substrate 114, and place the one or more semiconductor devices on the target substrate 118. The controller 106 may include, among other components, a memory 130 and a processor 128. The memory 130 stores instructions for operating the PUT 104. The memory 130 may be any memory storage, such as an SRAM, DRAM, ROM, or any other computer memory storage. The processor 128 executes the instructions stored in the memory 130 and sends out the instructions to the PUT 104 via a signal interface (not shown). The processor 128 may cause the display assembly system 100 to perform the methods described in further detail with reference to FIG. 5.

In some embodiments, the PUT 104 may include a plurality of pick-up heads 124. Each pick-up head 124 can pick up a light-emitting structure 112 from the carrier substrate 114, and place the semiconductor device on the target substrate 118. After picking up a light-emitting structure 112, the pick-up head 124 may be aligned with a location on the target substrate 118.

The actuator 122 may comprise an electro-mechanical component that controls the movement of the PUT 104 based on instructions from the controller 106, as executed by the processor 128 from instructions stored in memory 130, and thus controls the transfer of the light-emitting structure 112 from carrier substrate 114 and placement on the target substrate 118. For example, the actuator 122 may move the PUT 104, or individual pick-up head 124, with three degrees of freedom including up and down, left and right, and forward and back. In some embodiments, the PUT 104 has more than three degrees of freedom. For example, the PUT 104 may have six degrees of freedom, allowing for lateral motion up and down, left and right, and forward and back, as well as rotational motion along three different axes. The actuator 122 may be embodied, for example, as a rotating motor, a linear motor, or a hydraulic cylinder.

The controller 106 may align the one or more pick-up heads 124 with the target substrate 118, and place the light-emitting structures 112 attached to the one or more pick-up heads 124 on the target substrate 118.

The display assembly system 100 may include one or more carrier substrates 114. For example, different carrier substrates 114 may carry different color LED dies. A carrier substrate 114 may be carrier film that holds singulated light-emitting structures 112 for transfer to the target substrate 118. The system may include one or more target substrates 118. In some embodiments, such as when the target substrate 118 comprises the display substrate for receiving the light-emitting structures 112, the target stage 120 may include a heater for thermal conductive bonding of the electrical contact pads of the light-emitting structures 112 to the target substrate 118 subsequent to placement of the light-emitting structures 112 on the target substrate 118 by the PUT 104. In other embodiments, the display assembly system 100 may include a laser system for laser bonding of the electrical contact pads of the light-emitting structures 112 to the target substrate 118 subsequent to placement of the light-emitting structures 112 on the target substrate 118 by the PUT 104.

In some embodiments, the display assembly system 100 may comprise multiple PUTs 104 each positioned at a separate station. Each station may be dedicated to the PUT of a particular color LED, such as a green station for green LEDs, a red station for red LEDs, and a blue station for blue LEDs, etc. Different colored LEDs are grown on different native substrates, which may be different carrier substrates 114 as shown in FIG. 1, due to differences in their composition and structure.

In embodiments in which the light-emitting structures 112 comprise μLEDs, creating enough Van der Waals force between the pick-up surface of the light-emitting structures 112 and the pick-up heads 124 is important, since the small surface of the μLEDs reduces the surface area over which the Van der Waals interactions can occur. Furthermore, during movement of the carrier substrate 114 (e.g., to move the light-emitting structures 112 to another location of the display assembly system 100, which may occur during the course of display manufacture), the light-emitting structures 112 are ideally secured, so that when the pick-up heads 124 come into contact with the pick-up surface of the light-emitting structures 112, the two surfaces align and there is minimal tilting of the light-emitting structures 112. Using a carrier adhesive layer 115 on the carrier substrate 114 as described in FIGS. 3A-5C, the pick-and-place technique of the display assembly system 100 can be used to successfully place light-emitting structures 112 from the carrier substrate 114 to the target substrate 118.

In some embodiments, the force between the pick-up surface of the light-emitting structures 112 and the pick-up heads 124 may be any adhesion force in addition to or other than a Van der Waals force. For example, the pick-up heads 124 may include grippers that grip the light-emitting structures 112 and remove them from the carrier substrate 114. In other examples, the pick-up heads 124 may pick up light-emitting structures 112 using electrostatic forces. As such, the term "adhesion layer" as used herein, can refer to a layer causing adhesion using any/all of these adhesion forces.

The display assembly system 100 includes an etcher 126. The etcher 126 etches the carrier adhesive layer 115 of the light-emitting structure 112 on the carrier substrate 114 based on instructions received from the controller 106. The carrier adhesive layer 115 is described in further detail with reference to FIGS. 3A-5C. The etcher 126 can etch the carrier adhesive layer 115 without substantially affecting the light-emitting structure 112. The etcher 126 may comprise, for example, an oxygen dry-etcher, such as a Radio Frequency (RF) oxygen plasma reactor. In other embodiments, the etcher 126 may dry-etch a carrier adhesive layer 115 with any gas that selectively removes the carrier adhesive layer 115 without affecting the structure of the light-emitting structure 112. For example, the etcher 126 may use air plasma or ammonia (NH3), chlorine, boron, or fluorocarbon gas or any other gas capable of removing a carrier adhesive layer 115. The etcher 126 may include gas intake and gas outtake valves, ionizing plates, and any other standard etching components. It can be noted that the etcher 126 may be located within a chamber (not shown) so that other components of the display assembly system 100 are not damaged during the etching process. In some embodiments, the etcher 126 may be a tool distinct from the display assembly system 100.

FIG. 2A is a cross-sectional view of a schematic diagram of a light-emitting structure 112, which may comprise a μLED die, in accordance with one embodiment. The light-emitting structure 112 may include, among others, a semiconductor element 202, and electrical contacts 206. The semiconductor element 202 may, in some embodiments, comprise semiconducting material such as gallium nitride (GaN), gallium arsenide (GaAs), or the like, made by epitaxial growth (epitaxy) or other fabrication methods. The electrical contacts 206 serve as interconnects for the light-emitting structure 112 when the light-emitting structure 112 is mounted to a display substrate. The semiconductor element height 214 (in the Z direction illustrated in FIG. 2A) may vary, depending on desired functionality, manufacturing processes, and/or other factors.

The electrical contacts 206 may be provided in the form of bumps or microbumps, for interconnection of the light-emitting structure 112 to an electrical conductor. The electrical contacts may be arranged on a surface of the light-emitting structure 112 and may be formed on top of the p- and n- contacts of an LED in the semiconductor element 202, which may be arranged on a single side of the semiconductor element 202 opposite to the light-emitting surface 208. The electrical contacts 206 may be made of a metal (e.g., copper (Cu), tin (Sn), Gold (Au), and/or other metals) to interconnect to metal pads (e.g., Cu and/or Au pads) on electrical conductors on a display substrate. In some embodiments, a single electrical contact 206 for an LED (e.g., the anode) may be located near the LED (e.g., on a surface opposite the light-emitting surface of the LED), and the other electrical contact 206 (e.g., the cathode) may be electrically connected with other LEDs in the light-emitting structure, forming a common electrical contact 206, which may be located elsewhere (e.g., at an end of the light-emitting structure 112).

FIG. 2B is a perspective view of a light-emitting structure 112, according to an embodiment. Here, the light-emitting structure 112 comprises a die having two rows of offset μLEDs 210 (which effectively may comprise a single output row in the resulting display, depending on desired functionality). That is, rows may be offset to provide a more compact horizontal (or vertical) output pitch in the resulting display. Additionally, as illustrated in FIG. 2B, electrical contacts 206 may be slightly offset from corresponding μLEDs 210. That is, depending on manufacturing and/or other concerns, the center of an electrical contact 206-1 may not align with the center of a corresponding μLED 210-1 to which the electrical contact 206-1 is electrically connected, as illustrated by the center line 212.

It can be noted that, alternative embodiments may vary from the embodiment illustrated in FIG. 2B. For example, μLEDs 210 (or other light-emitters) may be arranged differently on the light-emitting structure 112, the light-emitting structure 112 may have a different shape, there may be more or fewer rows (including only a single row) of μLEDs 210, μLEDs 210 may have two contacts each (e.g., rather than sharing a common electrical contact among multiple μLEDs 210) and/or there may be more or fewer μLEDs 210 (including only a single μLED 210), etc. A person of ordinary skill in the art will appreciate other such variations.

It can be noted that FIGS. 2A and 2B are simplified drawings provided for illustrative purposes. Embodiments of a light-emitting structure 112 may comprise additional features not explicitly shown in FIGS. 2A and 2B, or other figures herein. For example, embodiments may include one or more obtrusions, or mesas, which may help direct light generated by the light-emitting structure 112. Some embodiments may include mesas located on a surface opposite the light-emitting surface 208. In such embodiments, an electrical contact 206 may be located on or near a mesa.

FIGS. 3A-3E are cross-sectional diagrams illustrating different stages of a process of manufacturing a display device, according to one embodiment, which may be performed by a display assembly system, such as the display assembly system 100 of FIG. 1. The stages illustrated in FIGS. 3A-3E can be performed as a part of the singulation process of light-emitting structures 112 as part of the process of manufacturing a display device, and illustrate the utility of the carrier substrate 114 in the carrier stage 116, according to some embodiments. However, a person of ordinary skill in the art will recognize that different singulation processes may need to be used with different materials. According to some embodiments, the process illustrated and described in FIGS. 3A-5 may be utilized in embodiments where the fabrication substrate and/or semiconductor element 202 comprise GaAs, for example.

Figure 3A:
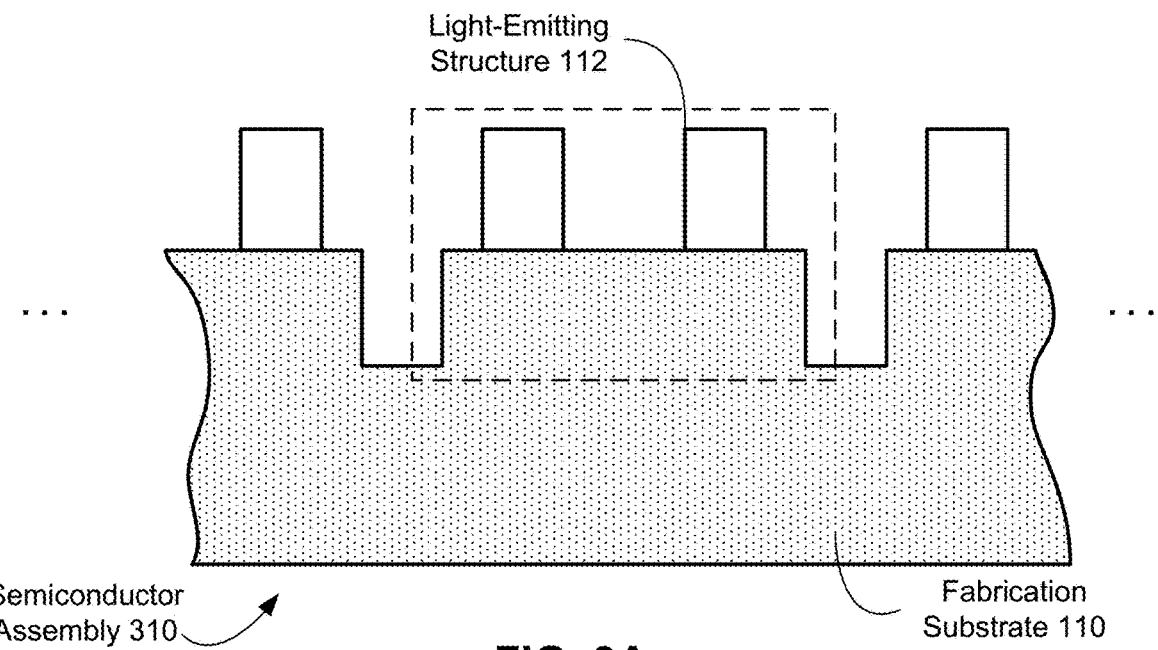
FIGS. 3A-3E are cross-sectional diagrams illustrating different stages of a process of manufacturing a display device.

FIG. 3A is a cross-sectional view of a semiconductor assembly 310, according to embodiments. The semiconductor assembly may comprise a fabrication substrate 110 on which one or more light-emitting structures 112 are fabricated prior to being singulated. Again, depending on the materials used, different semiconductor fabrication processes may be used (e.g., doping, photolithography, etching, etc.) to fabricate the one or more light-emitting structures 112. According to some embodiments, for example, light-emitting structures 112 may be fabricated from an AlGaAs layer formed on a bulk GaAs fabrication substrate 110. Depending on desired functionality, light-emitting structures 112 may initially comprise part of a monolithic fabrication substrate 110, or may be grown, deposited, or otherwise formed on top of the fabrication substrate 110. To facilitate subsequent singulation, cavities 330, or "singulation streets," may be etched or otherwise made between the light-emitting structures 112. According to some embodiments, for example, cavities 330 may be made using dry etching and a mask (which may be formed using a photolithographic process).

Figure 3B:
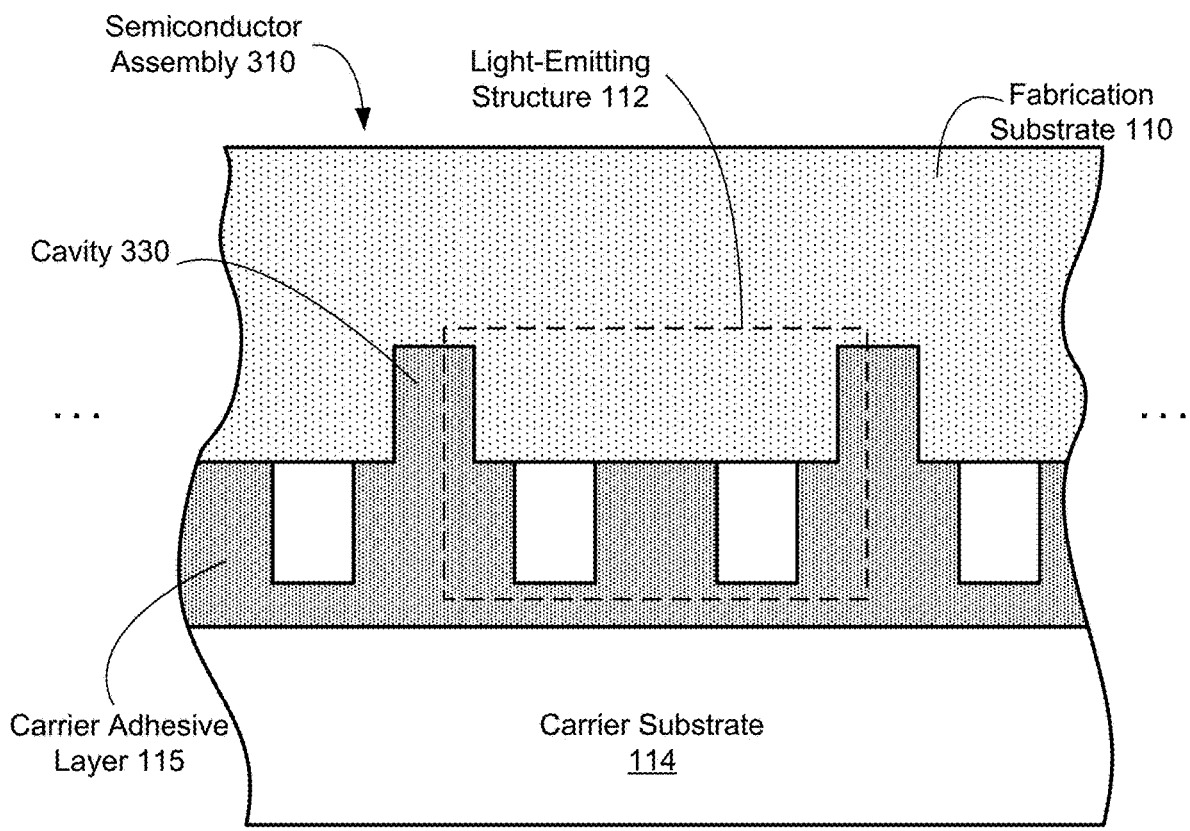

FIG. 3B is a cross-sectional view of the semiconductor assembly 310 of FIG. 3A (turned upside-down relative to FIG. 3A) coupled with a carrier substrate 114 using a carrier adhesive layer 115. Here, the carrier adhesive layer 115 may comprise a polymer that is in a liquid or semi-liquid state (prior to being cured) with a viscosity to enable the semiconductor assembly 310 to be at least partially pressed into the carrier adhesive layer 115. As can be seen, the adhesive of the carrier adhesive layer 115 may fill the cavities 330. Although illustrated as filling the cavities 330 entirely in FIG. 3B, other embodiments may only partially fill in the cavities 330. The carrier adhesive layer 115 may be cured once the semiconductor assembly 310 has been inserted into the carrier adhesive layer 115.

Figure 3C:
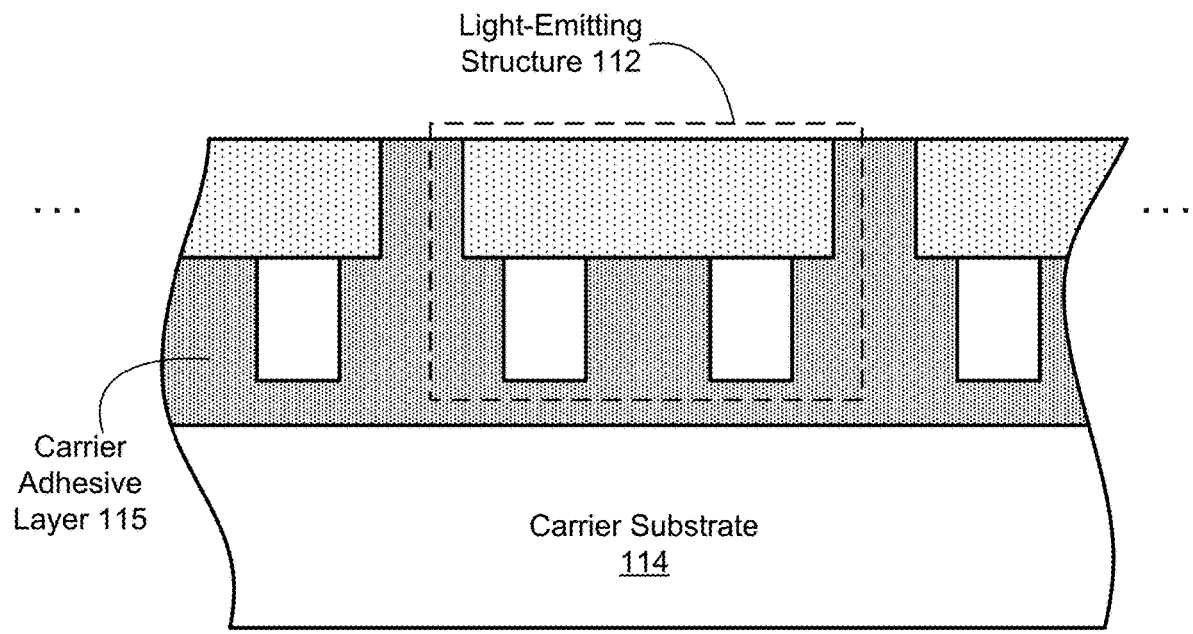

FIG. 3C illustrates a stage, in which light-emitting structures 112 are singulated by removing the fabrication substrate 110 (not shown in FIG. 3C). According to some embodiments, wet etching may be used to remove the fabrication substrate 110. Once the fabrication substrate 110 is removed, portions of the carrier adhesive layer 115 separate the light-emitting structures 112 (and thus, light-emitting structures 112 are singulated), enabling them to be individually decoupled from the carrier substrate 114 using, for example, a PUT 104 and placed on a target substrate 118.

Figure 3D:
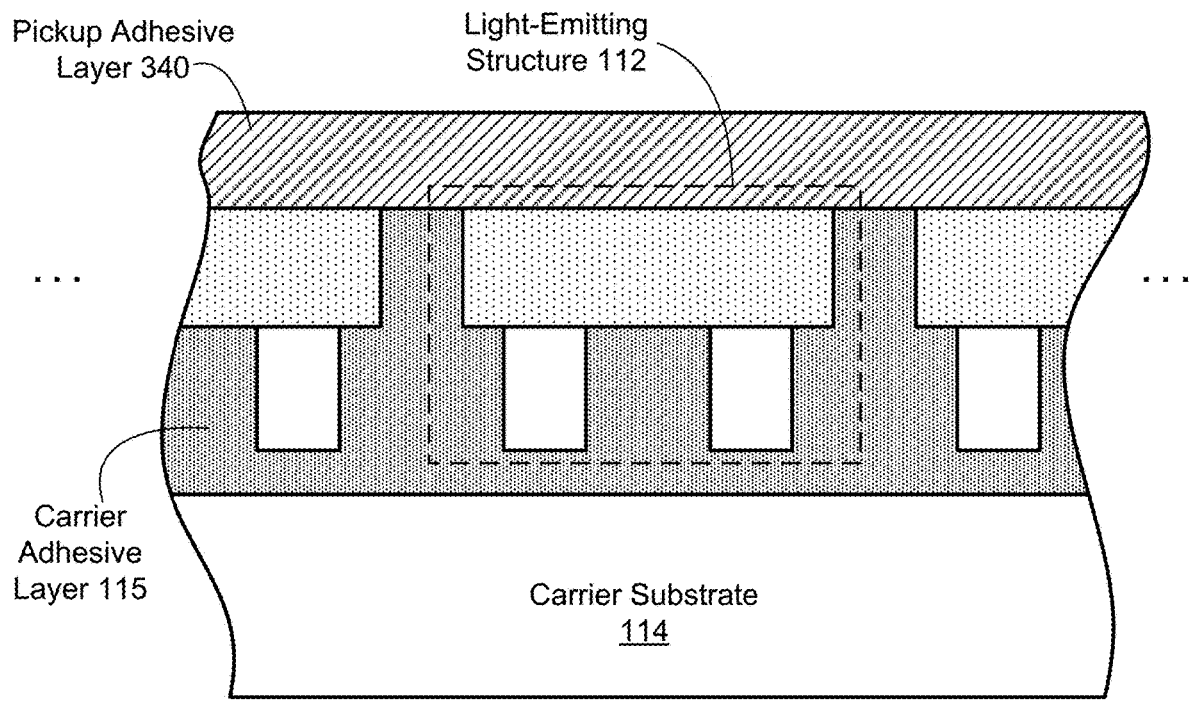

To help enable the light-emitting structures 112 to be decoupled from the carrier substrate 114 by a PUT 104 (once all or a portion of the carrier adhesive layer 115 has been subsequently removed), an additional adhesive layer (known as a "eLayer" (elastomer layer) or "cLayer" (conforming layer)) may be formed on the light-emitting structures 112, as illustrated in FIG. 3D. Here, the additional adhesive layer, or "pickup adhesive layer" 340, may comprise an elastomer, such as Polydimethylsiloxane (PDMS). According to some embodiments, the pickup adhesive layer 340 may be deposited using spin coating. However, portions of the pickup adhesive layer 340 may then need to be removed in order to enable the light-emitting structures 112 to be individually decoupled with the carrier substrate 114.

Figure 3E:
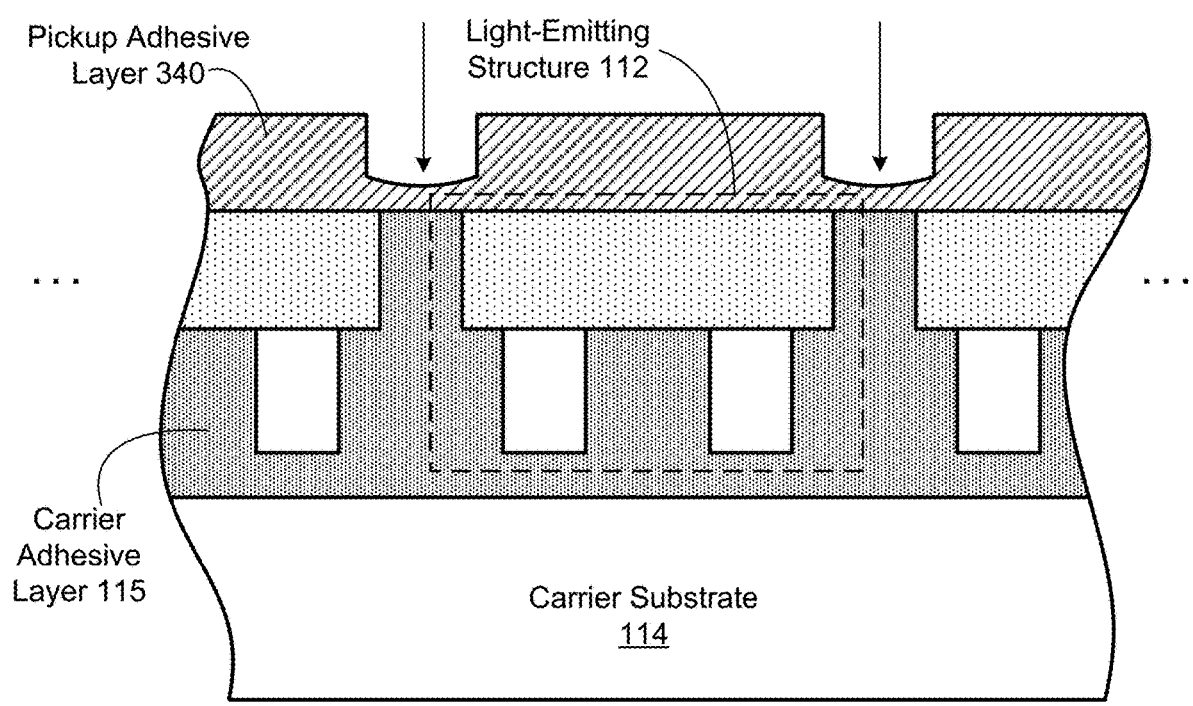

FIG. 3E illustrates a process by which portions of the pickup adhesive layer 115 between the light-emitting structures 112 may be removed in order to enable the light-emitting structures 112 (with remaining portions of the pickup adhesive layer 115) to be decoupled with the carrier substrate 114. Here, etching is used to remove portions of the pickup adhesive layer 340.

The process illustrated in FIGS. 3A-3E can be disadvantageous for several reasons. The etching of portions of the pickup adhesive layer 340, for example, may not necessarily be aligned with portions of the underlying carrier adhesive layer 115 separating the light-emitting structures 112. Moreover, the etching process illustrated in FIG. 3E can involve a series of additional steps involving not only the etching itself, but also the creation and utilization of a mask (not shown) through a series of photolithographic steps.

According to embodiments herein, these issues can be avoided utilizing a process that creates self-aligned recesses and avoids the need to etch the pickup adhesive layer 340. An example of an embodiment is illustrated in FIGS. 4A-4F.

Figure 4A:
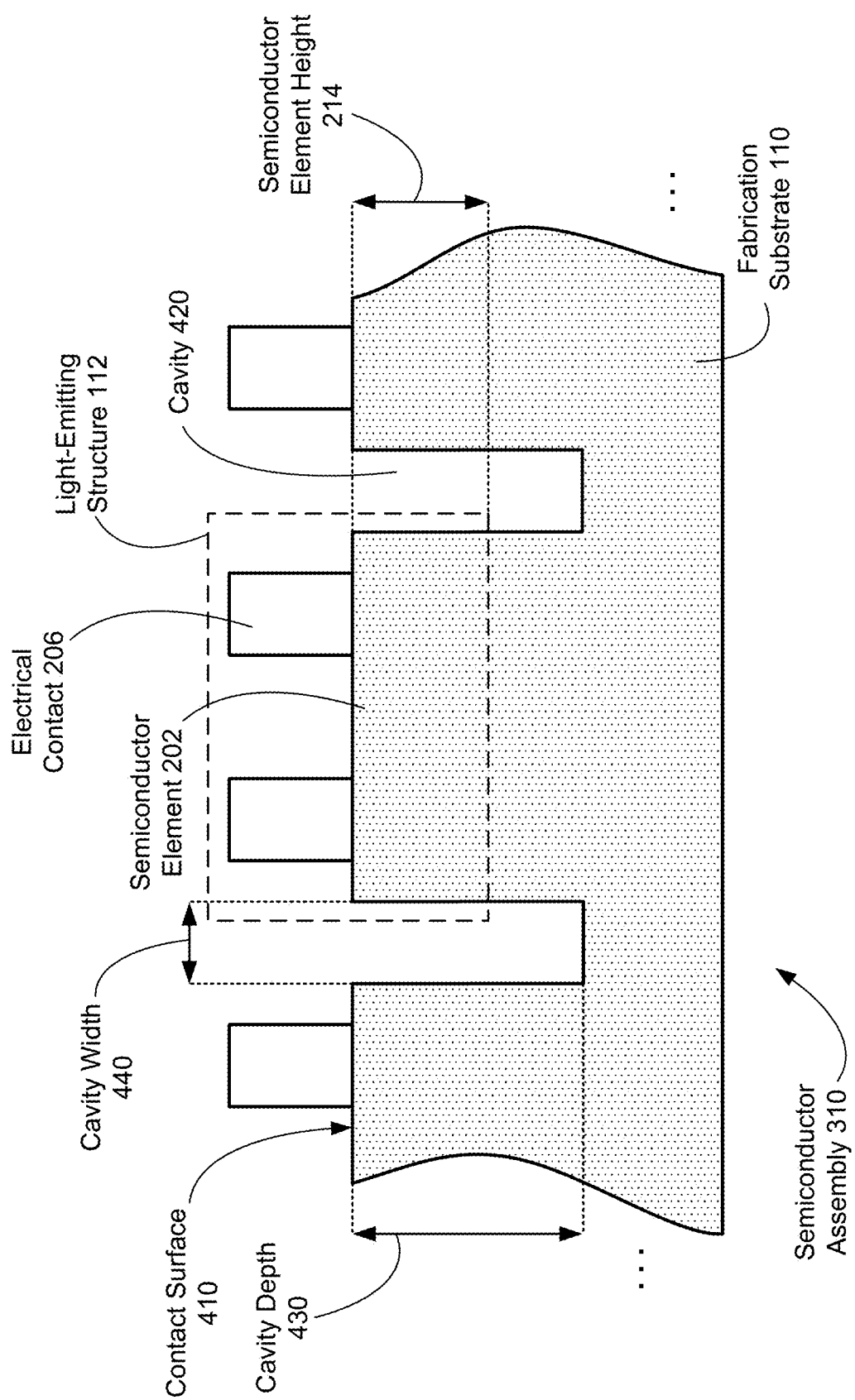
FIGS. 4A-4F are cross-sectional diagrams illustrating different stages of a process of manufacturing a display device in which self-aligned recesses are created, according to an embodiment.

FIG. 4A is a cross-sectional diagram of a stage in the process of manufacturing light-emitting structures 112 in which the light-emitting structures 112 are created on the semiconductor assembly 310. Similar to the stage illustrated in FIG. 3A, light-emitting structures 112 comprise electrical contacts 206 coupled with semiconductor elements 202 at a contact surface 410. Here, however, cavities 420 may be created that extend far deeper than those illustrated in FIG. 3A. More specifically, cavities 420 may extend into the fabrication substrate 110 of the semiconductor assembly 310 at a cavity depth 430 that exceeds the semiconductor element height 214. Again, the semiconductor element 202 may comprise, in some embodiments, an AlGaAs layer formed in a GaAs fabrication substrate 110.

The extent to which the cavity depth 430 exceeds the semiconductor element height 214 may correspond with a desired thickness of a pickup adhesive layer to be deposited on the light-emitting structures 112 at a subsequent stage. The cavity with 440 may vary, depending on desired functionality, manufacturing concerns, and/or other factors. According to some embodiments, the cavity depth 430 may be approximately 3 µm, and the cavity with 440 may be between 2-4 µm. These dimensions may vary in other embodiments.

Figure 4B:
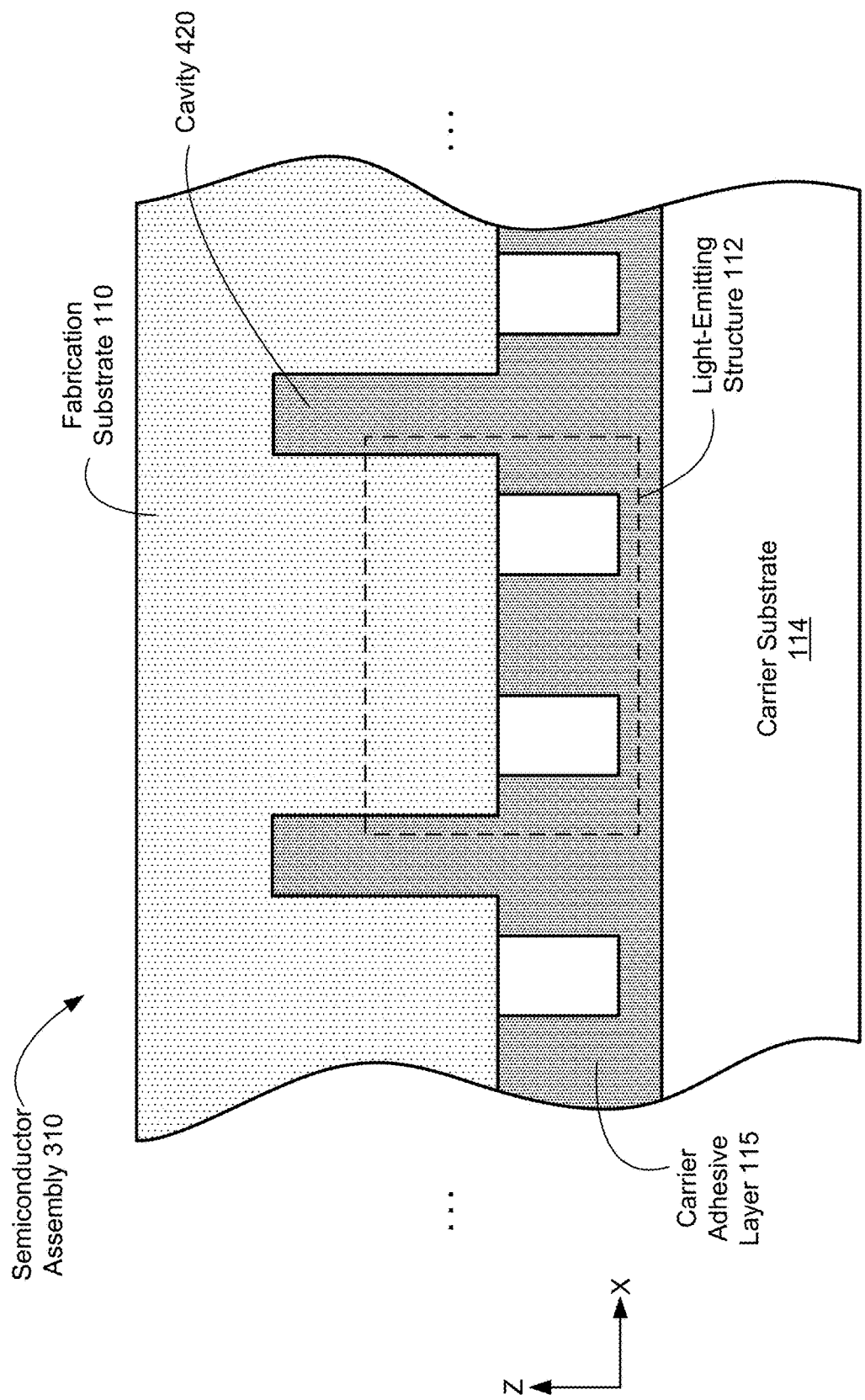

FIG. 4B illustrates a stage, subsequent to the stage illustrated in FIG. 4A, in which the semiconductor assembly 310 (comprising the fabrication substrate 110 and light-emitting structures 112) is coupled with the carrier substrate 114 via a carrier adhesive layer 115. As described previously, this can be done by forming the carrier adhesive layer 115 on the carrier substrate 114, applying a force to press the semiconductor assembly 310 into the carrier adhesive layer 115 while the carrier adhesive layer 115 is sufficiently viscous to enable the semiconductor assembly 310 to be at least partially pressed into the carrier adhesive layer 115. As illustrated, the cavities 420 are at least partially filled with adhesive material from the carrier adhesive layer 115. Put differently, the adhesive layer 115 extends into the fabrication substrate 110 to form walls of the adhesive layer 115 within the cavity 420. According to some embodiments, physical stops may be utilized to help ensure the semiconductor assembly 310 is not pressed too closely to the carrier substrate 114 to cause damage to the light-emitting structures 112. That said, although FIG. 4B illustrates an embodiment in which the semiconductor assembly does not physically contact the carrier substrate 114, other embodiments may cause the semiconductor assembly 310 to physically contact with the carrier substrate 114 at this stage. According to some embodiments, once the semiconductor assembly 310 is sufficiently coupled with the carrier substrate 114, and prior to the removal of the fabrication substrate 110, the carrier adhesive layer 115 may be cured.

Figure 4C:
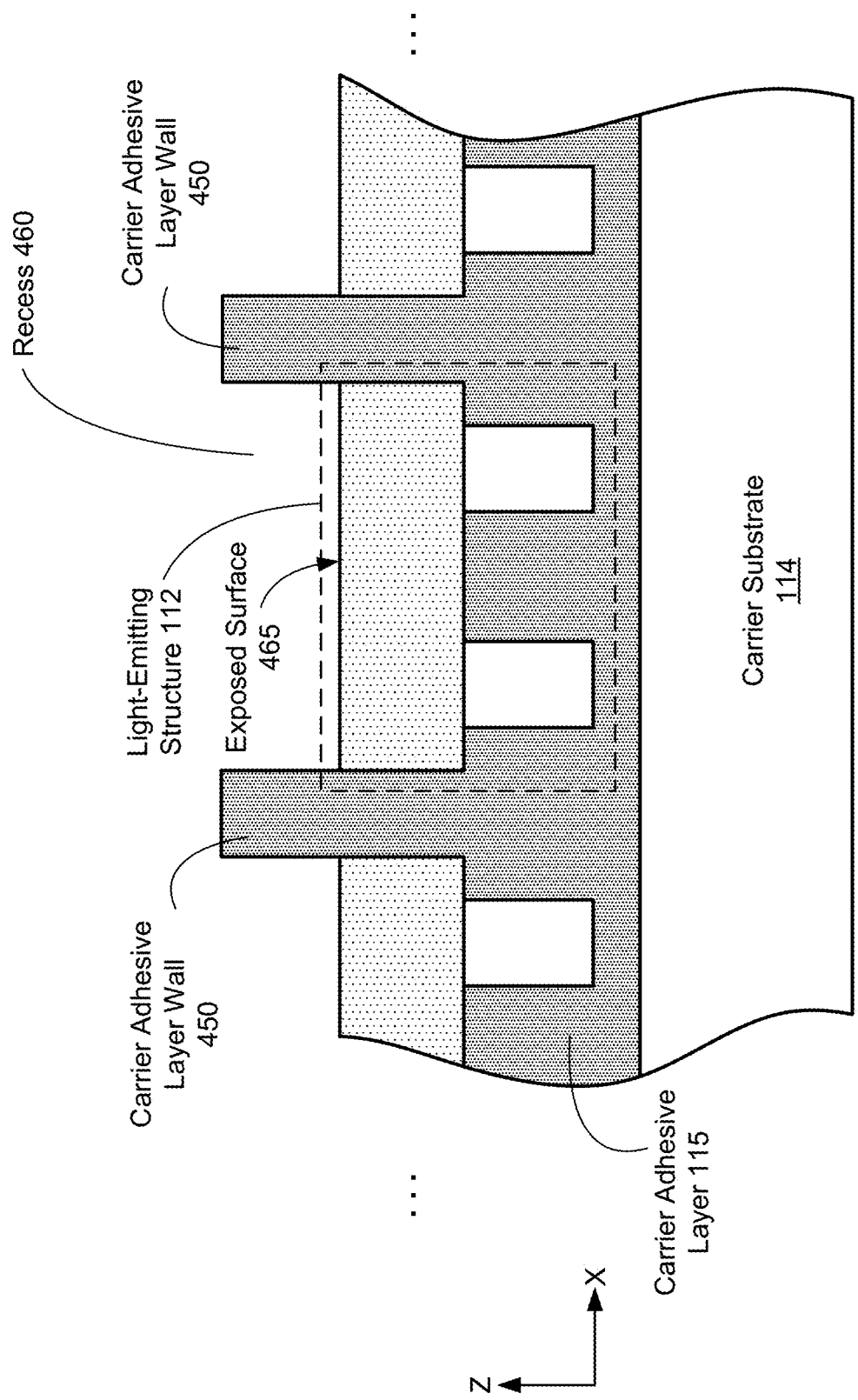

At the stage illustrated in FIG. 4C, light-emitting structures 112 are singulated through the removal of the fabrication substrate 110 (not shown in FIG. 4C). Techniques for removing the fabrication substrate 110 may vary, depending on materials used, manufacturing concerns, and/or other factors. In embodiments in which the fabrication substrate 110 comprises GaAs, for example, the fabrication substrate 110 may be removed through a wet etching process.

As illustrated, various portions of the carrier adhesive layer 115, may protrude above the light-emitting structures 112. These protrusions are located between light-emitting structures 112, forming carrier adhesive layer walls 450 around the light-emitting structures 112. Recesses 460 are thereby formed, defined by the carrier adhesive layer walls 450 surrounding exposed surfaces 465 of the light-emitting structures 112 within the recesses 460. As shown in FIG. 4E and described in more detail below, the carrier adhesive layer walls 450 help contain a pickup adhesive layer 340 in the recesses 460, thereby avoiding any need to etch the pickup adhesive layer 340 in order to pick up individual light-emitting structures 112, and therefore avoiding the alignment and other issues related to the etching that can complicate the manufacturing process.

Figure 4D:
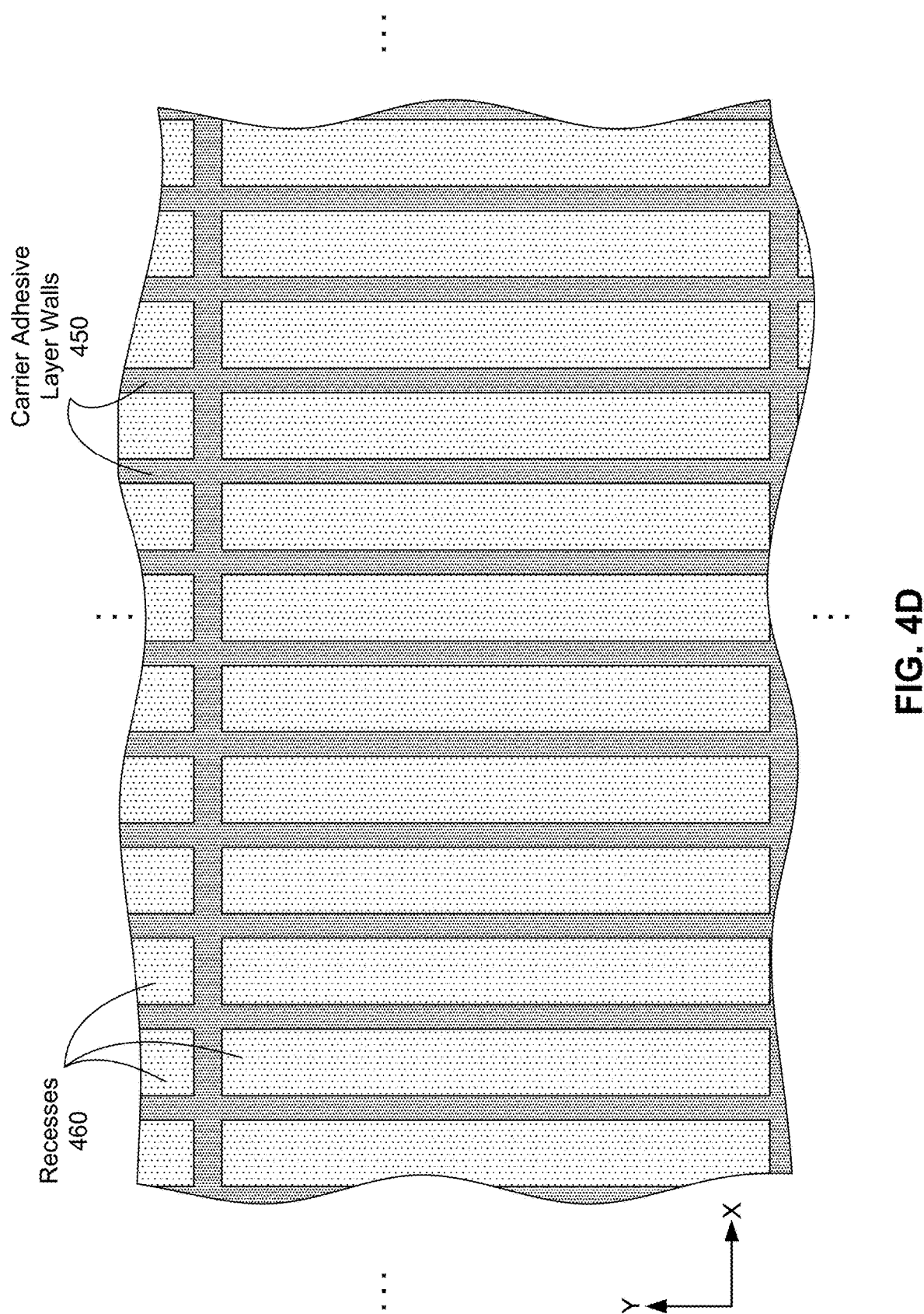
Figure 4E:
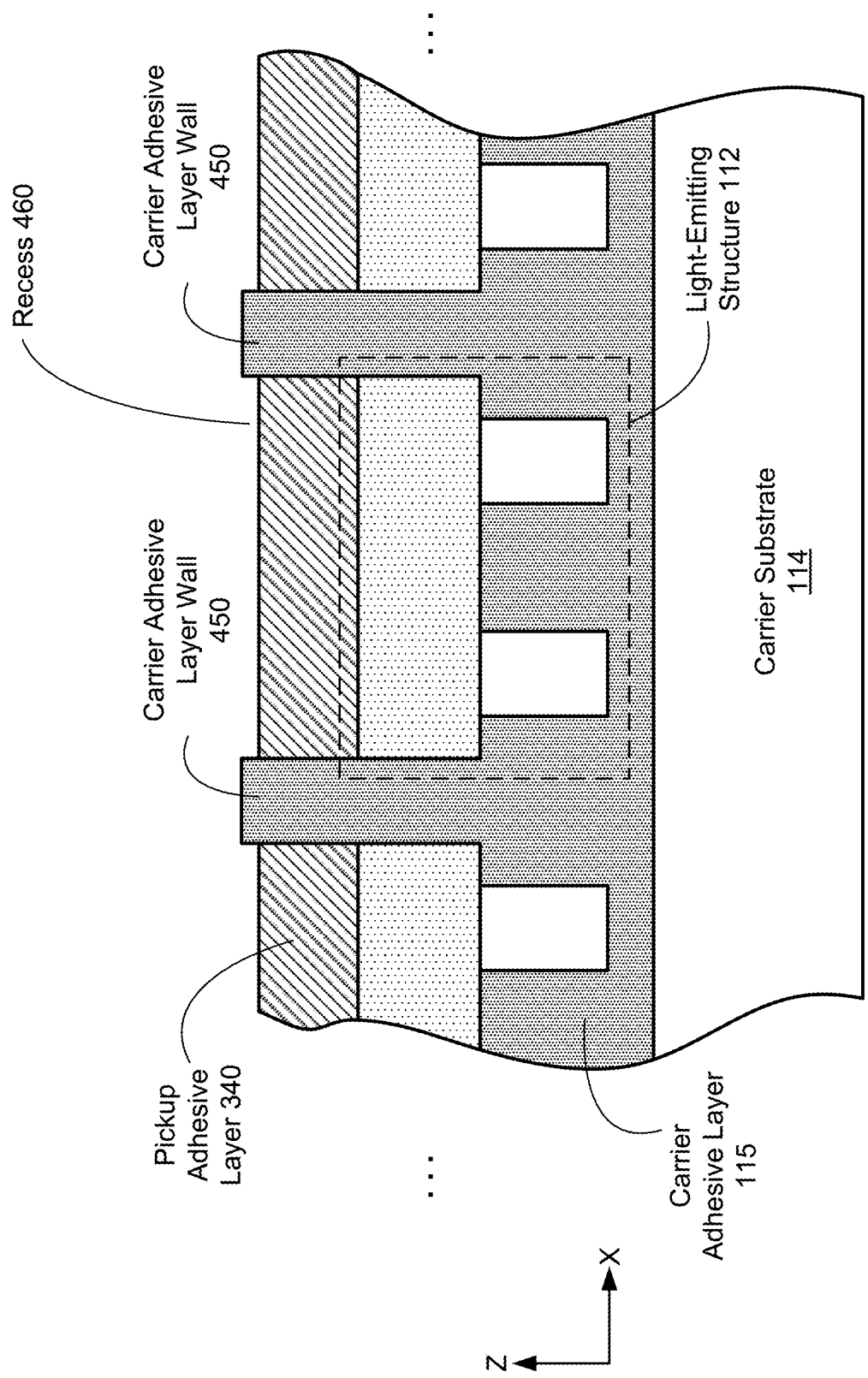

FIG. 4D illustrates an overhead view of the stage of the process illustrated in FIG. 4C. (That is, where FIG. 4C illustrates a cross-sectional diagram in the XZ plane, FIG. 4D illustrates an overhead view in the XY plane.) As can be seen, carrier adhesive layer walls 450 may extend above the light-emitting structures, such that the light-emitting structures 112 are disposed in recesses within the carrier adhesive layer 115. Although recesses 460 (and light-emitting structures disposed therein) are illustrated as rectangular features in FIG. 4D, it will be appreciated by a person of ordinary skill in the art that alternative embodiments may use light-emitting structures of different proportions, shapes, and/or sizes.

At this stage illustrated in FIG. 4E, a pickup adhesive layer 340 is formed in each of the recesses 460 of the carrier adhesive layer 115, between the carrier adhesive layer walls

Figure 4F:
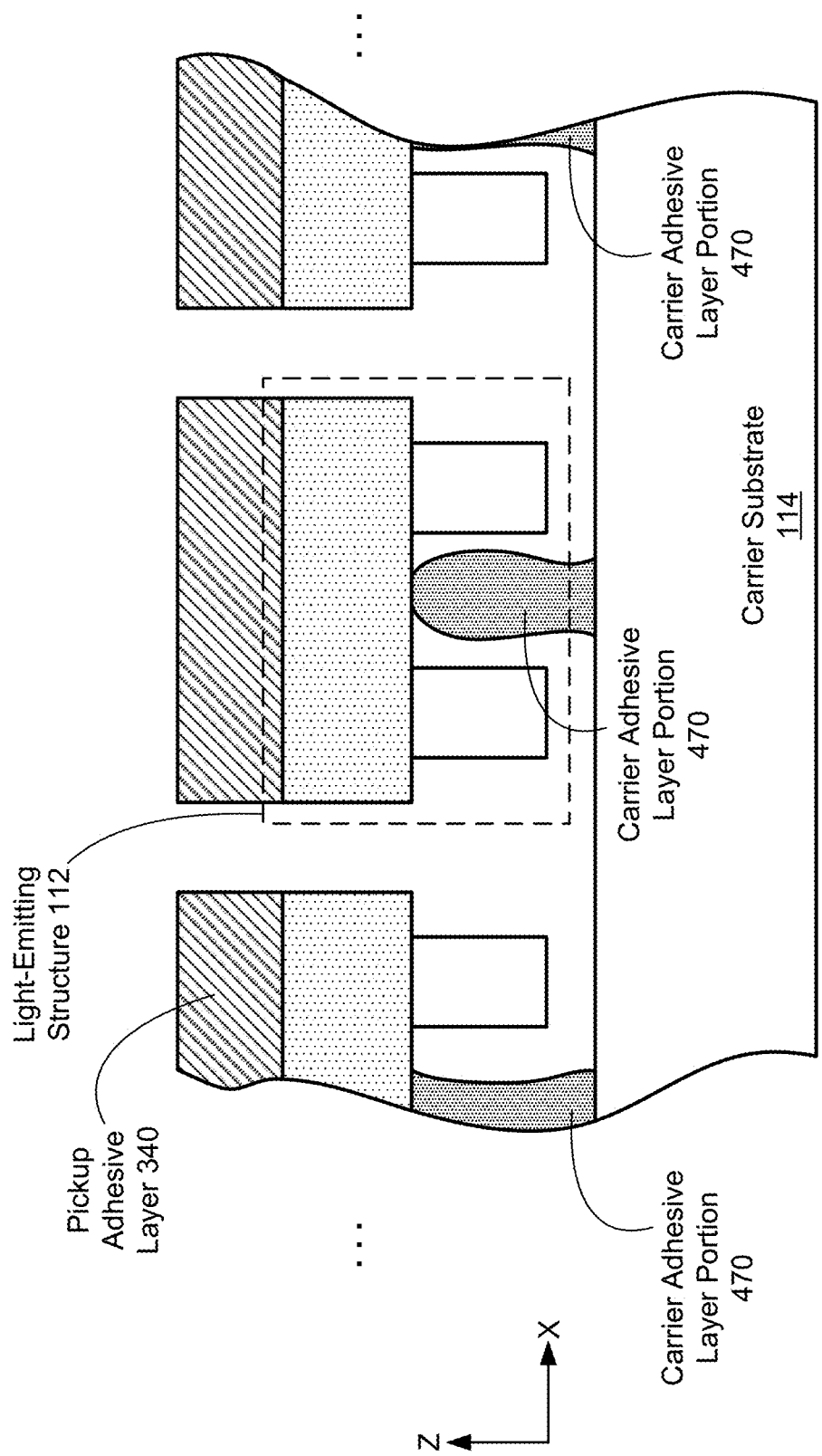

450. This pickup adhesive layer 340 may be formed by spin coating, for example. (In some embodiments, based on the viscoaelastic properties of the layer material (before curing), the spin coating process can be can be fine-tuned to result in singulated layers. Thus, in some embodiments there may be no need to etch the pickup adhesive layer 340 as shown in FIG. 4F). Again, the pickup adhesive layer 340 may comprise an "eLayer" of elastomer (e.g., PDMS) to help enable a PUT 104 to decouple the light-emitting structure 112 from the carrier substrate 114. Because the carrier adhesive layer walls 450 may extend above the pickup adhesive layer 340, there may be no need to etch the pickup adhesive layer 340 in any way. That said, embodiments may include some etching of the pickup adhesive layer 340. However, in such cases, no additional photolithographic steps are needed to create a mask for the etching process because the carrier adhesive layer walls 450 extend between the pickup adhesive layers 340 of the different light-emitting structures 112, thereby intrinsically separating the pickup adhesive layer 340. As such, the creation of the carrier adhesive layer walls 450 as illustrated in the embodiment shown in FIGS. 4A-4F (in contrast to the process illustrated in FIGS. 3A-3E) avoids the need for photolithographic steps for forming a mask to etch the pickup adhesive layer 340 (and thereby avoid any misalignments between the pickup adhesive layer 340 and light-emitting structures 112), and may forgo the need to etch the pickup adhesive layer 340 at all. Moreover, because carrier adhesive layer walls 450 are formed between light-emitting structures 112, the pickup adhesive layers 340 are self-aligned light-emitting structures 112.

Finally, as shown in FIG. 4F, all or part of the carrier adhesive layer 115 may be removed in preparation for the decoupling of light-emitting structures 112 from the carrier substrate 114. As shown, in some embodiments, the carrier adhesive layer 115 may be only partially removed such that carrier adhesive layer portions 470 remain. These carrier adhesive layer portions 470 may be utilized in some embodiments to help ensure the light-emitting structures 112 remain coupled to the carrier substrate 114 until decoupled from the carrier substrate 114 by the PUT 104 (not shown). Because the carrier adhesive layer portions 470 may contact only a small portion of the light-emitting structures 112, the adhesive force of the PUT 104 (once coupled with the pickup adhesive layer 340 of a respective light-emitting structure 112) may overcome the adhesive force of the carrier adhesive layer portion 470, enabling the light-emitting structure 112 to become decoupled from the carrier substrate 114.

Figure 5:
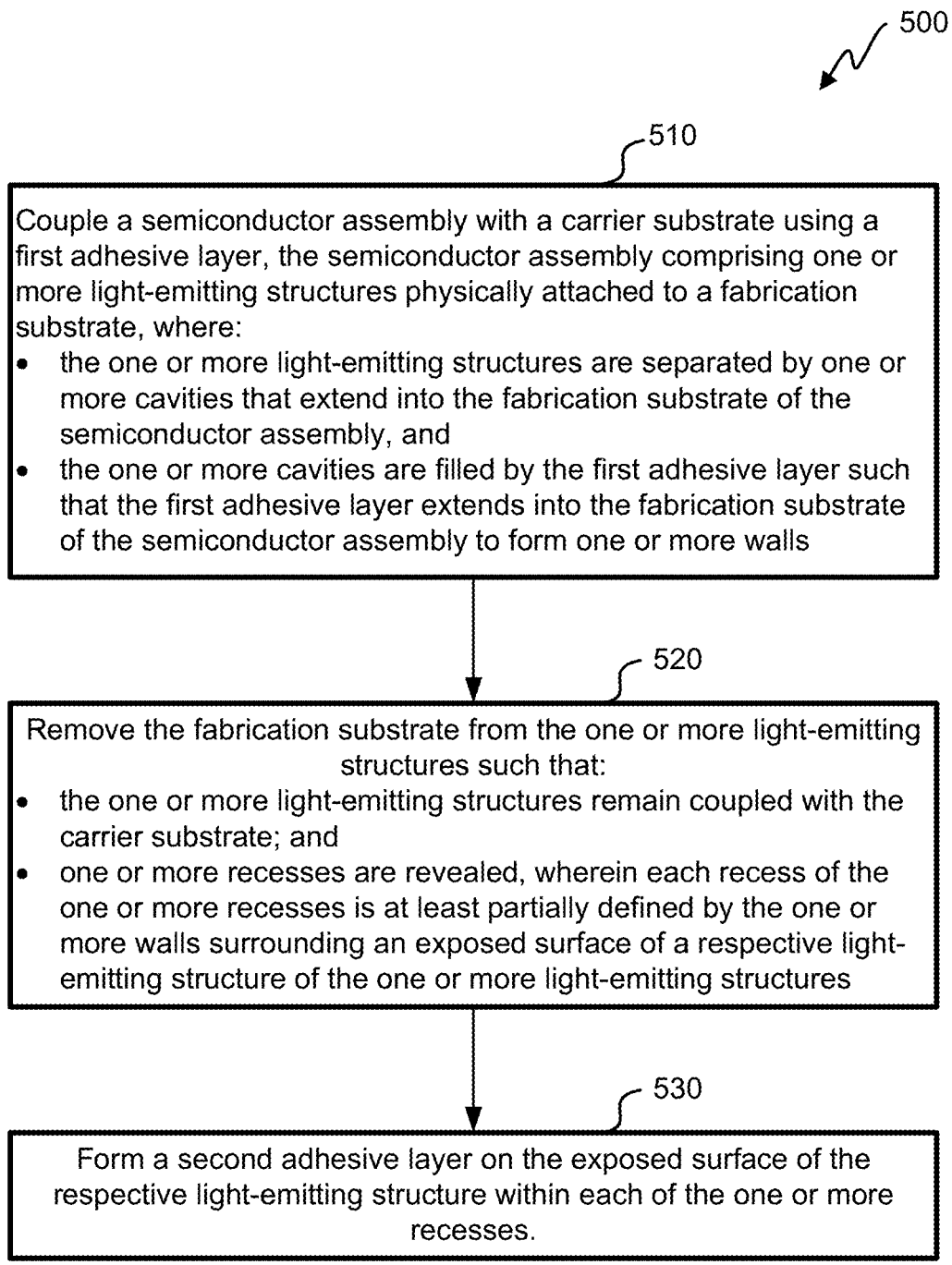
FIG. 5 is a flow diagram of a method of manufacturing a light-emitting structure, according to an embodiment.

FIG. 5 is a flow diagram of a method 500 of manufacturing a light-emitting structure, according to an embodiment. The light-emitting structures may correspond to light-emitting structures 112 as described herein and illustrated in FIGS. 1-4F. As noted in the above embodiments, light-emitting structures may comprise one or more active light-emitting components, such as μLEDs 210 (e.g., as illustrated in FIG. 2B). Moreover, it can be noted that, similar to other figures herein, FIG. 5 is provided as a non-limiting example. Alternative embodiments may add, separate, rearrange, and/or otherwise alter the functionality of the blocks illustrated in FIG. 5. A person of ordinary skill in the art will recognize such alterations. Means for performing the method may include a manufacturing assembly, including hardware and/or software components of a computing device, such as controller 106 of FIG. 1 and associated components (e.g., processor 128, memory 130, actuator(s) 122, PUT 104, and/or etcher 126).

At block 510, the functionality includes coupling a semiconductor assembly with a carrier substrate using a first adhesive layer. As illustrated in FIGS. 4A and 4B, for example, a semiconductor assembly can comprise one or more light-emitting structures physically attached to a fabrication substrate, where the one or more light-emitting structures are separated by one or more cavities that extend into the fabrication substrate of the semiconductor assembly and the one or more cavities are filled by the first adhesive layer such that the first adhesive layer extends into the fabrication substrate of the semiconductor assembly to form one or more walls. As illustrated in FIG. 4B, for example, the first adhesive layer may comprise a carrier adhesive layer 115 coupled with a carrier substrate 114. Moreover, as noted in the embodiments above, this first adhesive layer may comprise a polymer. According to some embodiments, the fabrication substrate may comprise GaAs and/or GaN, and/or each of the one or more light-emitting structures comprises AlGaAs and/or AlInGaP. In some embodiments, coupling the semiconductor with the carrier substrate using the first adhesive layer may comprise applying a force to press the semiconductor assembly at least partly into the first adhesive layer. Additionally or alternatively, each of the one or more light-emitting structures may comprise at least one row of light-emitting elements on a surface of the respective light-emitting structure. In some embodiments, these elements may comprise μLEDs, as noted above. According to some embodiments, the method 500 may further comprise forming one or more cavities in the semiconductor assembly.

At block 520, the method 500 further comprises removing the fabrication substrate from the one or more light-emitting structures such that the one or more light-emitting structures remain coupled with the carrier substrate and one or more recesses are revealed, where each recess of the one or more recesses is at least partially defined by the one or more walls surrounding an exposed surface of a respective light-emitting structure of the one or more light-emitting structures. As illustrated in FIG. 4C and described above, for example, singulation of the light-emitting structures 112 may occur when the fabrication substrate is removed (e.g., using a wet-etching process). Because carrier adhesive layer walls 450 may extend into the fabrication substrate, the removal of the fabrication substrate can form recesses defined by the carrier adhesive layer walls 450 surrounding one or more exposed surfaces 465 of one or more respective light-emitting structures 112.

At block 530, the method 500 includes forming a second adhesive layer on the exposed surface of the respective light-emitting structure within each of the one or more recesses. Such formation may use spin-on coating, for example. In some embodiments, the second adhesive layer (e.g. a pickup adhesive layer) may comprise an elastomer, such as PDMS. Some embodiments may include subsequent steps, such as removing at least a portion of the first adhesive layer, and after removing the at least a portion of the first adhesive layer, decoupling the one or more light-emitting structures from the carrier substrate with a PUT.

According to embodiments, the method 500 may include one or more additional functions, depending on desired functionality.

Figure 6:
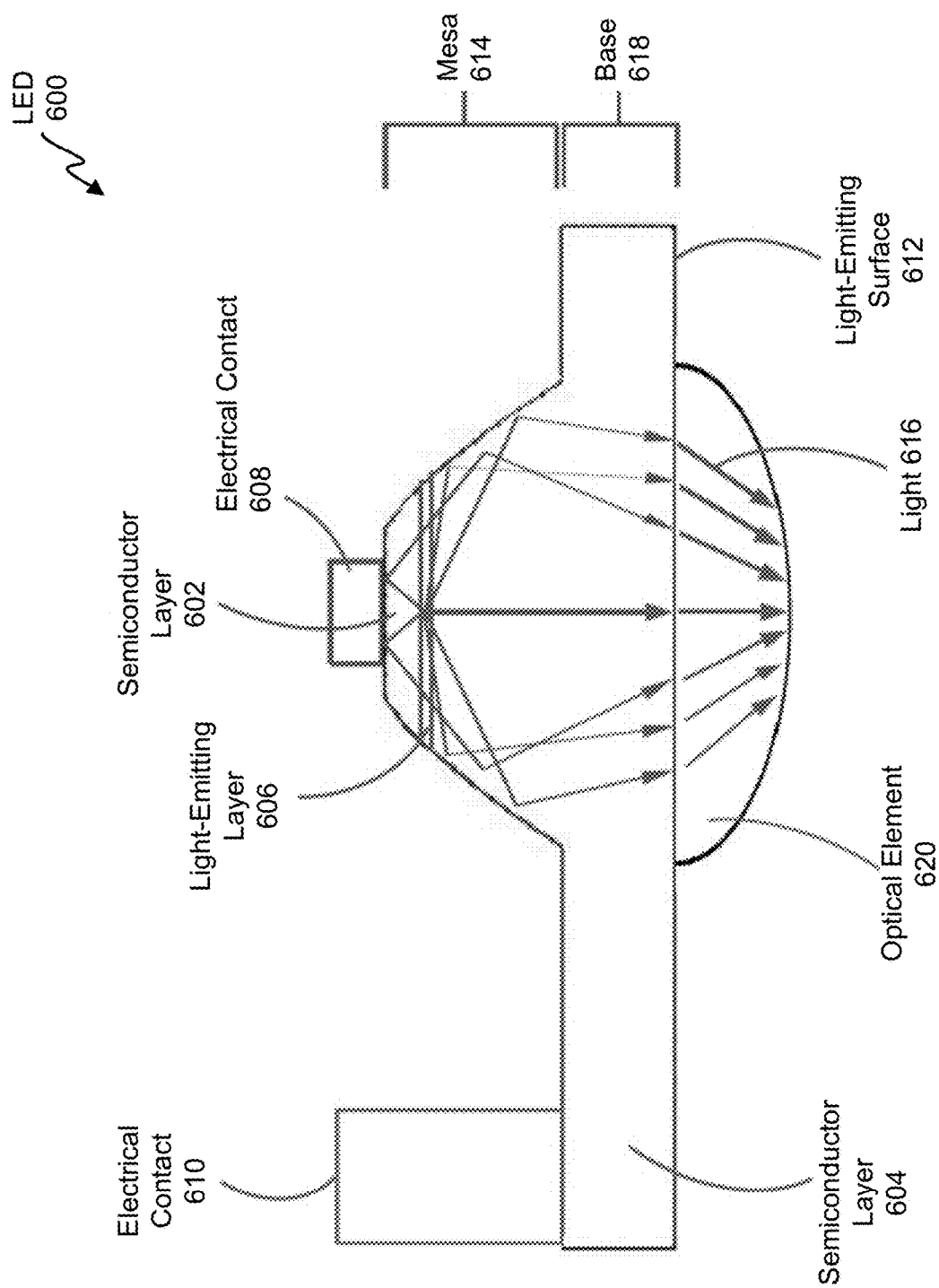
FIG. 6 is a cross-sectional view of an example of an LED, according to an embodiment.

FIG. 6 is a cross-sectional view of an example LED 600, which may be incorporated into a light-emitting structure 112 as described herein, according to some embodiments. The LED 600 may be a micro-LED, which may have an active light-emitting area 606 with a linear dimension that is less than 50 μm, less than 20 μm, or less than 10 μm. For example, the linear dimension may be as small as 2 μm or 4 μm. Their small size enables a display system to have a single pixel including three micro-LEDs: a red micro-LED, a green micro-LED, and a blue micro-LED. Their small size also enables micro-LEDs to be lightweight, making them particularly suitable for use in wearable display systems, such as watches and computing glasses. Although only one LED 600 is shown in FIG. 6, a plurality of LEDs may be formed simultaneously in a light-emitting structure, as illustrated in FIG. 2B.

The LED 600 includes, among other components, a semiconductor structure. The semiconductor structure includes semiconductor layers 602 and 604 and a light-emitting layer 606 that sits between the semiconductor layers 602 and 604. For example, the LED 600 may include a semiconductor structure in which the light-emitting layer 606 is a layer of indium gallium nitride that is sandwiched between a layer of p-type gallium nitride and a layer of n-type gallium nitride. In some embodiments, semiconductor layer 602 is a p-type semiconductor, and semiconductor layer 604 is an n-type semiconductor. In some embodiments, semiconductor layer 602 is an n-type semiconductor, and semiconductor layer 604 is a p-type semiconductor.

The semiconductor layers 602 and 604 are operatively coupled to electrical contacts 608 and 610, respectively (which may correspond to electrical interconnects 206 of the light-emitting structure 112, as illustrated in FIG. 2A). The electrical contacts 608 and 610 are typically made of a conductive material, such as a metallic material. In the example of FIG. 6, the electrical contacts 608 and 610 are both located on a top surface of the semiconductor structure such that they can both support the LED 600 when it is mounted on a substrate including a control circuit. However, in some embodiments, electrical contacts can be located on opposite surfaces of a semiconductor structure.

The light-emitting layer 606 includes one or more quantum wells that output light 616 when a voltage is applied across the electrical contacts 608 and 610. To directionalize the output of light 616, the semiconductor structure may be formed into any of a variety of shapes (e.g., a paraboloid, a cylinder, or a cone) that enable collimation/quasi-collimation of light 616. Such shapes are referred to herein as "mesa" shapes; and collimation and quasi-collimation are collectively referred to herein as "collimation". Collimation results in increased brightness of light output.

In the example of FIG. 6, mesa 614 corresponds to a paraboloid shape that guides light 616 toward through a light-emitting surface 612 of the semiconductor structure. More specifically, the light-emitting layer 606 is approximately positioned at the focal point of the paraboloid such that some of the emitted light is reflected, within a critical angle of total internal reflection, off the inner walls of the paraboloid toward the light-emitting surface 612.

In some embodiments, a mesa shape also has a truncated top that can accommodate an electrical contact. In the example of FIG. 6, mesa 614 corresponds to a paraboloid shape having a truncated vertex that accommodates electrical contact 608. Base 618 refers to the part of the semiconductor structure that is not included in the mesa 614.

To enable further collimation of light 616, an optical element 620 can be formed on the light-emitting surface 612. In the example of FIG. 6, the optical element 620 is a microlens. As will be described in greater detail below, the optical element 620 can be formed from an elastomeric material or a photoresist.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A method of manufacturing light-emitting structures, the method comprising:
    coupling a semiconductor assembly with a carrier substrate using a first adhesive layer, the semiconductor assembly comprising one or more light-emitting structures physically attached to a fabrication substrate, wherein:
        the one or more light-emitting structures are separated by one or more cavities that extend into the fabrication substrate of the semiconductor assembly; and
        the one or more cavities are filled by the first adhesive layer such that the first adhesive layer extends into the fabrication substrate of the semiconductor assembly to form one or more walls;
    removing the fabrication substrate from the one or more light-emitting structures such that:
        the one or more light-emitting structures remain coupled with the carrier substrate; and
        one or more recesses are revealed, wherein each recess of the one or more recesses is at least partially defined by the one or more walls surrounding an exposed surface of a respective light-emitting structure of the one or more light-emitting structures; and
    forming a second adhesive layer on the exposed surface of the respective light-emitting structure within each of the one or more recesses.

2. The method of claim 1, further comprising:
    removing at least a portion of the first adhesive layer, and
    after removing the at least a portion of the first adhesive layer, decoupling the one or more light-emitting structures from the carrier substrate with a pickup tool (PUT).

3. The method of claim 1, wherein the first adhesive layer comprises a polymer.

4. The method of claim 1, wherein coupling the semiconductor assembly with the carrier substrate using the first adhesive layer comprises applying a force to press the semiconductor assembly at least partly into the first adhesive layer.

5. The method of claim 1, wherein each of the one or more light-emitting structures comprises at least one row of light-emitting elements on a surface of the respective light-emitting structure.

6. The method of claim 1, wherein the second adhesive layer comprises an elastomer.

7. The method of claim 6, wherein the elastomer comprises Polydimethylsiloxane (PDMS).

8. The method of claim 1, wherein the fabrication substrate comprises gallium arsenide (GaAs).

9. The method of claim 1, wherein a respective semiconductor element of each of the one or more light-emitting structures comprises aluminum gallium arsenide (AlGaAs).

10. The method of claim 1, further comprising forming the one or more cavities in the semiconductor assembly.

11. A non-transitory, computer-readable medium having instructions embedded thereon for manufacturing light-emitting structures, wherein, the instructions, when executed by one or more assembly devices, cause the one or more assembly devices to:
    couple a semiconductor assembly with a carrier substrate using a first adhesive layer, the semiconductor assembly comprising one or more light-emitting structures physically attached to a fabrication substrate, wherein:
        the one or more light-emitting structures are separated by one or more cavities that extend into the fabrication substrate of the semiconductor assembly; and
        the one or more cavities are filled by the first adhesive layer such that the first adhesive layer extends into the fabrication substrate of the semiconductor assembly to form one or more walls;
    remove the fabrication substrate from the one or more light-emitting structures such that:
        the one or more light-emitting structures remain coupled with the carrier substrate; and
        one or more recesses are revealed, wherein each recess of the one or more recesses is at least partially defined by the one or more walls surrounding an exposed surface of a respective light-emitting structure of the one or more light-emitting structures; and
    form a second adhesive layer on the exposed surface of the respective light-emitting structure within each of the one or more recesses.

12. The non-transitory, computer-readable medium of claim 11, wherein the instructions, when executed by the one or more assembly devices, further cause the one or more assembly devices to:
    remove at least a portion of the first adhesive layer, and
    after removing the at least a portion of the first adhesive layer, decouple the one or more light-emitting structures from the carrier substrate with a pickup tool (PUT).

13. The non-transitory, computer-readable medium of claim 11, wherein the instructions, when executed by the one or more assembly devices, cause the one or more assembly devices to perform the coupling of the semiconductor assembly with the carrier substrate using the first adhesive layer at least in part by applying a force to press the semiconductor assembly at least partly into the first adhesive layer.

14. The non-transitory, computer-readable medium of claim 11, wherein the instructions, when executed by the one or more assembly devices, cause the one or more assembly devices to perform the forming of the second adhesive layer on the exposed surface of the respective light-emitting structure at least in part by depositing an elastomer on the exposed surface of the respective light-emitting structure.

15. The non-transitory, computer-readable medium of claim 11, wherein the instructions, when executed by one or more assembly devices, further cause the one or more assembly devices to form the one or more cavities in the semiconductor assembly.

16. An assembly system for of manufacturing light-emitting structures, the assembly system comprising:
    a memory; and
    a processor communicatively coupled with the memory and configured to cause the assembly system to:
        couple a semiconductor assembly with a carrier substrate using a first adhesive layer, the semiconductor assembly comprising one or more light-emitting structures physically attached to a fabrication substrate, wherein:

the one or more light-emitting structures are separated by one or more cavities that extend into the fabrication substrate of the semiconductor assembly; and the one or more cavities are filled by the first adhesive layer such that the first adhesive layer extends into the fabrication substrate of the semiconductor assembly to form one or more walls;

remove the fabrication substrate from the one or more light-emitting structures such that:

the one or more light-emitting structures remain coupled with the carrier substrate; and one or more recesses are revealed, wherein each recess of the one or more recesses is at least partially defined by the one or more walls surrounding an exposed surface of a respective light-emitting structure of the one or more light-emitting structures; and form a second adhesive layer on the exposed surface of the respective light-emitting structure within each of the one or more recesses.

17. The assembly system of claim 16, wherein the processor is further configured to cause the assembly system to: remove at least a portion of the first adhesive layer, and after removing the at least a portion of the first adhesive layer, decouple the one or more light-emitting structures from the carrier substrate with a pickup tool (PUT).

18. The assembly system of claim 16, wherein the processor is further configured to cause the assembly system to couple the semiconductor assembly with the carrier substrate using the first adhesive layer at least in part by applying a force to press the semiconductor assembly at least partly into the first adhesive layer.

19. The assembly system of claim 16, wherein the processor is configured to cause the assembly system to form the second adhesive layer on the exposed surface of the respective light-emitting structure at least in part by depositing an elastomer on the exposed surface of the respective light-emitting structure.

20. The assembly system of claim 16, wherein the processor is further configured to cause the assembly system to form one or more cavities in the semiconductor assembly.

* * * * *